(12) United States Patent
Deutchman et al.

(10) Patent No.: US 7,374,642 B2
(45) Date of Patent: May 20, 2008

(54) TREATMENT PROCESS FOR IMPROVING THE MECHANICAL, CATALYTIC, CHEMICAL, AND BIOLOGICAL ACTIVITY OF SURFACES AND ARTICLES TREATED THEREWITH

(76) Inventors: Arnold H. Deutchman, 2200 Lane Rd., Columbus, OH (US) 43220; Robert J. Partyka, 3405 Kirkham Rd., Columbus, OH (US) 43221; Robert J. Borel, 12363 Colliers Reserve Dr., Naples, FL (US) 34110

( * ) Notice: Subject to any disclaimer, the term of this patent is extended or adjusted under 35 U.S.C. 154(b) by 46 days.

(21) Appl. No.: 11/042,150

(22) Filed: Jan. 26, 2005

(65) Prior Publication Data
US 2005/0167261 A1    Aug. 4, 2005

Related U.S. Application Data

(60) Provisional application No. 60/539,996, filed on Jan. 30, 2004.

(51) Int. Cl.
*C23C 14/34* (2006.01)
*C23C 16/00* (2006.01)

(52) U.S. Cl. ............................ 204/192.11; 204/192.15; 204/192.16; 427/524; 427/525; 427/527; 427/528; 427/534; 427/587; 427/591; 427/592

(58) Field of Classification Search ........... 204/192.11, 204/192.16, 192.15, 298.04, 298.05; 118/723 VE, 118/723 EB, 723 CB, 723 MP, 723 FI; 427/524, 525, 527, 528, 534, 587, 592, 591
See application file for complete search history.

(56) References Cited
U.S. PATENT DOCUMENTS 4,863,810 A    9/1989  Bhattacharya et al. ...... 428/661
4,933,058 A  * 6/1990  Bache et al. ............. 204/192.3
4,992,298 A  * 2/1991  Deutchman et al. ........ 427/524
5,055,318 A   10/1991  Deutchman et al. .......... 427/38
5,258,028 A  * 11/1993  Ersek et al. ............. 623/23.73

(Continued)

OTHER PUBLICATIONS

Weigand et al. "Ion-beam-sputter modification of the surface morphology of biological implants", J. Vac. Sci. Technol., vol. 14, No. 1, Jan./Feb. 1977, pp. 326-331.*

*Primary Examiner*—Rodney G. McDonald
(74) *Attorney, Agent, or Firm*—Baker & Hostetler LLP

(57) ABSTRACT

A continuous, uninterrupted two-step treatment process capable of forming nanometer scale physical structures on the surface of articles fabricated from metallic, ceramic, glass, or plastic materials, and then depositing a thin conformal coating on the nanostructured surface such that the physical structures previously produced are neither masked nor are the dimensions of the physical structures substantially altered. In an additional embodiment, a thicker coating can be grown from the thin conformal coating which itself can be nanostructured as it is deposited. In this case adhesion of the thicker coating is not dependent upon the use of conventional surface pretreatments such as machining, chemical etching, or abrasive blasting. Surface texturing may be performed by ion beam sputtering, and ion assisted coating forms the thin conformal coating, and thicker coating if desired. The treatment process is useful for improving the mechanical, catalytic, chemical, or biological activity of the surfaces so treated. The process thus has application on industrial machinery and equipment of all types, engines of all types, manufacturing tooling and wear parts of all types, and medical equipment and prostheses.

17 Claims, 7 Drawing Sheets

U.S. PATENT DOCUMENTS

| | | | |
|---|---|---|---|
| 5,389,195 A | 2/1995 | Ouderkirk et al. | 156/643 |
| 5,482,602 A * | 1/1996 | Cooper et al. | 204/192.11 |
| 5,520,664 A * | 5/1996 | Bricault et al. | 604/265 |
| 5,628,659 A | 5/1997 | Xie et al. | 445/3 |
| 6,054,185 A | 4/2000 | Inspektor | 427/419.7 |
| 6,162,513 A | 12/2000 | Koh et al. | 427/533 |
| 6,284,377 B1 * | 9/2001 | Veerasamy | 428/408 |
| 6,413,380 B1 | 7/2002 | Pinarbasi | 204/192.11 |
| 6,478,931 B1 | 11/2002 | Wadley et al. | 204/192.12 |
| 6,613,204 B2 | 9/2003 | Xie et al. | 204/298.04 |
| 6,809,066 B2 | 10/2004 | Reade et al. | 505/411 |
| 2002/0134667 A1 | 9/2002 | Driskell et al. | |
| 2004/0230301 A1 | 11/2004 | Driskell et al. | |

* cited by examiner

TREATMENT PROCESS FOR IMPROVING THE MECHANICAL, CATALYTIC, CHEMICAL, AND BIOLOGICAL ACTIVITY OF SURFACES AND ARTICLES TREATED THEREWITH

CROSS-REFERENCE TO RELATED APPLICATIONS

This application claims priority to and is a provisional U.S. patent application entitled, TREATMENT PROCESS FOR IMPROVING THE MECHANICAL, CATALYTIC, CHEMICAL, AND BIOLOGICAL ACTIVITY OF SURFACES AND ARTICLES TREATED THEREWITH filed Jan. 30, 2004, having a Ser. No. 60/539,996, the disclosure of which is hereby incorporated by reference in its entirety.

FIELD OF THE INVENTION

The present invention relates generally to the surface treatment of fabricated mechanical devices. More particularly, the present invention relates to the surface treatment of fabricated mechanical devices to optimize either their mechanical behavior, catalytic behavior, chemical activity, or biological activity as required in order to improve their operating performance and usefulness.

BACKGROUND OF THE INVENTION

The surfaces of mechanical devices used as components in machinery, or individually as singular devices, often must be treated to improve their operating performance. A wide variety of conventional surface treatment processes are available, all designed to modify and coat the surface regions of mechanical devices fabricated from materials including metals, plastics, ceramics and glass. Surface treatments include both finishing and coating processes. Finishing involves modifying surface topography of the device so that it has the required texture (either roughness or smoothness). Machining, grinding and polishing processes are all classified as conventional finishing processes and are effective at providing surface textures down to the level of 0.1 micron ($10^{-7}$ meters) or so. Surface coating processes add a layer (or multiple layers) of material to the surface in order to enhance properties such as wear-resistance and corrosion-resistance. Engineered coatings, i.e., coatings designed to be functional as opposed to decorative, can be deposited with a number of conventional processes including electroplating, thermal spraying, physical vapor deposition (PVD) and chemical vapor deposition (CVD). Coating thicknesses can range from as thin as 1 micron (PVD) to as thick as 1,500 microns or more (thermal spraying). Conventional coating processes almost always require the use of surface texturing as a pretreatment prior to coating to help optimize mechanical adhesion of the coating.

The ability to provide, and control, surface texturing at dimensions in the nanometer range ($10^{-9}$ meters) is very desirable for a number of applications where mechanical, chemical, catalytic, and biological properties of surfaces need to be optimized. Furthermore, the ability to provide conformal coatings that do not conceal these nanometer-range structures is also desirable, as is the ability to grow thicker adherent coatings on a device surface without relying on the use of conventional surface finishing processes. By combining, into an uninterrupted two step process, surface texturing means at the nanometer range (nanostructuring) and subsequent coating means that allows deposition of thin conformal coatings that do not conceal the nanostructured surface, or if necessary, thicker coatings that do not require conventional pretreatments, the present invention provides a unique two-step process to improve the surface performance and usefulness of treated devices.

Step 1—Nanotexturing the Surface

Surface texturing of materials is usually achieved by either mechanical, chemical, or optical means. Mechanical processes such as machining, stamping, embossing, and abrasive blasting are not capable of producing structures at the nanometer range. Likewise chemical processes such as chemical machining and electropolishing are not usable because they produce a uniform smoothing of surface nanostructure. Texturing surfaces at the nanometer range with laser energy requires that the laser be focused down to these small dimensions, which is impractical. Atomic scale processes such as sputtering are used in the electronics industry for nanoscale processing of semiconductors and integrated electronics and thus could be employed to produce surface structures with dimensions in the range required. However, glow discharge sputtering (RF, DC, or magnetron) is non-directional in nature and will remove material from the surface isotropically thus tending to smooth out the surface. The present invention may utilize ion beam sputtering, since it is directional in nature, can effectively produce preferentially oriented material removal from surfaces leading to the development of nanometer-scale surface topography and is therefore the preferred mode for the first step in the surface treatment process disclosed.

However, the known art in directional ion beam sputtering techniques (also termed ion milling) used to modify structures of surfaces at the nanometer level does not attempt to combine sputtering with the application of an adherent conformal overcoat as an uninterrupted two step process. For example, Ouderkirk et al. (U.S. Pat. No. 5,389,195) teaches the use of ion beam sources to modify the surfaces of already-deposited thin films and polymeric substrates to improve their chemical properties. Koh et al. (U.S. Pat. No. 6,162,513) teaches modifying the surfaces of metals using ion beams and simultaneously flowing gases across the irradiated surface to improve the hydrophilicity of the surface. And, Bhattacharya et al. (U.S. Pat. No. 4,863,810) teaches the use of ion beams to modify the crystallinity of thin metallic films already deposited on surfaces to improve the corrosion resistance of the films.

Step 2—Providing the Conformal Coating

Once the nanometer-scale structures are produced in the treated surface, the resulting structures are conformally coated with a second material that, coupled with the increased surface area, will facilitate the mechanical, chemical, catalytic, or biological activity desired. Numerous physical and chemical coating techniques are available but very few are capable of depositing a tightly adherent coating that does not rely on mechanical interlocking for adhesion, and that does not conceal the nanostructured features. Painting, liquid dipping, electroplating, and thermal spray techniques all will completely mask nanometer scale structures. Vacuum evaporation and glow discharge sputter deposition techniques are capable of the conformal coating of nanometer scale structures but adhesion is not very effective. A precision coating technique is required that produces an initial penetration of the surface to form a shallow case layer to optimize adhesion, followed by growth of an extremely thin, nearly amorphous coating from the shallow case layer. The coating techniques must also be capable of forming thicker coatings in which the structure throughout can be maintained nanocrystalline and nearly amorphous as the coating is grown. A technique termed Ion Beam Enhanced Deposition (IBED) as taught by Deutchman et al. (U.S. Pat. No. 5,055,318) is capable of depositing a coating with these physical characteristics, and is the preferred mode for the second step in the surface treatment process disclosed.

The known art in IBED coating used to provide adherent coatings on surfaces does not attempt to combine directional ion beam sputtering techniques to modify structures of surfaces at the nanometer level prior to the application of an adherent conformal overcoat as an uninterrupted two step process. For example, Inspektor (U.S. Pat. No. 6,054,185) teaches using an ion beam assisted coating process to deposit multilayered coatings of boron nitride on the surfaces of metal tools to improve their wear-resistance. Wadley (U.S. Pat. No. 6,478,931) teaches using an ion beam assisted coating process to deposit multilayered coatings that are not intermixed with the surface or each other for producing magnetorestrictive films for magnetic recording sensors. And Pinarbasi (U.S. Pat. No. 6,413,380) teaches using ion beams to assist the deposition of coatings deposited by RF or DC sputtering processes for magnetorestrictive devices.

Reade et al. (U.S. Pat. No. 6,809,066) does however teach the combination of directional ion beam sputtering and means for coating the textured surface when used to apply multiple layers of thin nanostructured materials as required for superconductor devices. In the Reade et al. invention however the adhesion of the multiple layers on the substrate and among each other is dependent upon the chemical compatibility of the individual layers and not determined by the coating means. Xie et al. (U.S. Pat. No. 5,628,659) also teaches the use of ion beam sources to produce cones or microtips on thin layers deposited on substrates, and then overcoating the microtips with additional thin layers to produce a field emission devices for flat panel displays. However in this invention the sputter texturing requires that the surface to be textured be bombarded with an additional seed material, itself sputtered from an additional target. The formation of textured microtips is dependent upon the presence of this additional sputtered material. In addition, even though this art describes overcoating the microtips, the overcoating is not alloyed into the textured microtips, rather it merely lies on the surface. A divisional (U.S. Pat. No. 6,613,204) of the Xie et al. patent teaches the same art with the additional feature of mechanically abrading the thin layers to be textured to further facilitate microtip formation.

SUMMARY OF THE INVENTION

The foregoing needs are met, to a great extent, by the present invention, wherein in one aspect an apparatus and method is provided that in some embodiments offers a unique apparatus and method to engineer the surfaces of mechanical devices in that a surface nanotexturing means is combined with a coating means in an uninterrupted two-step process to form either a nanotextured surface with a thin conformal coating or a nanotextured surface with an adherent thick coating which itself can be nanostructured throughout.

In accordance with one aspect of the present invention, the invention offers the ability to produce engineered surfaces depending on the requirements of the specific application. For example, mechanical devices where chemical, metallurgical (for bondability), catalytic, or biological performance enhancements are needed often require surfaces with large surface areas and high densities of active sites for reactions. Thus nanostructured surfaces with conformal coatings that do not conceal the surface structures are required. And mechanical devices where mechanical properties such as wear-resistance, corrosion-resistance, fatigue-resistance, or reduced friction are needed require thicker coatings. Performance of thicker coatings can be optimized by controlling the properties of the surfaces upon which they are deposited and by growing the coatings with nanocrystalline, nearly amorphous grain structure. The present invention uses a process which finds use on industrial machinery and equipment of all types, engines of all types, manufacturing tooling and wear parts of all types, and medical equipment and prostheses.

In accordance with another aspect of the present invention, the invention also offers the ability to deposit highly adherent coatings on a wide variety of metallic, plastic, ceramic, and glass materials without the need to pretreat the surfaces of those materials with conventional processes such as abrasive blasting or chemical etching.

In accordance with still another aspect of the present invention, the invention further offers the ability to deposit a wide variety of types of coatings including, but not limited to metals (e.g., Cr, Ni, Ti, Al, Zr, Ag, Au, and Pt), oxides (e.g., $Al_2O_3$, $Zr_2O$, and YSZ), nitrides (e.g., TiN, $Cr_2N$, ZrN, HfN, and VN), and carbides (e.g., WC, TiC, and diamond-like carbon).

In accordance with still another aspect of the present invention, the invention also allows the ability to deposit highly adherent coatings on a wide variety of metallic, plastic, ceramic, and glass surfaces at temperatures that can be maintained below 200 degrees Fahrenheit if desired.

In accordance with still another aspect of the present invention, the invention allows for the angling and rotating of the parts to be treated relative to a single directional ion beam sputter source which improves the texturing efficiency, and reduces the complexity and cost of processing by not requiring multiple ion beam sources.

It is an object of this invention to provide a continuous, two-step process for the surface treatment of mechanical elements by first texturing the surfaces on a nanometer scale, and then without interruption, coating the nanotextured surfaces so that surface-related properties such as mechanical behavior, catalytic behavior, chemical activity, and biological activity can be improved.

It is a further object of this invention to provide a continuous, two-step process for the surface treatment of mechanical elements by first texturing the surfaces on a nanometer scale, and then without interruption, coating the nanotextured surfaces with a thin conformal coating, initially alloyed into the surface, that does not conceal the morphology of the nanotextured surface.

It is a further object of this invention that the grain structure of the thin conformal coat be nearly amorphous.

It is a further object of this invention to provide a continuous, two-step process for the surface treatment of mechanical elements by first texturing the surfaces on a nanometer scale, and then without interruption, coating the nanotextured surface with a thin conformal coating, initially alloyed into the surface, that does not conceal the morphology of the nanotextured coating, and then without interruption, growing a thicker coating from the thin conformal coating, the thicker coating itself being nanostructured as it is grown.

It is a further object of this invention that the grain structure of the thicker coating be nearly amorphous.

It is a further object of this invention that the adhesion of the thicker coating not rely upon surface texturing with conventional means such as machining, abrasive blasting, chemical etching, and the like.

It is a further object of this invention that the first texturing process be a directional ion beam sputtering process.

It is a further object of this invention that the first texturing process be a directional ion beam sputtering process that intercepts all surfaces to be treated within a certain specified angular range.

It is a further object of this invention that the first texturing process be a directional ion beam sputtering process that intercepts all surfaces to be treated within a certain specified angular range this being achieved by motion of the components in at least two dimensions.

It is a further object of this invention that the coating process used to grow the thin conformal coating be an ion assisted coating process.

It is a further object of this invention that the coating process used to grow the thicker coating continuously from the thin conformal coating be an ion assisted coating process.

It is a further object of this invention that the ion assisted coating process may employ ion beam sputtering as a means to generate the coating material to be applied to the surface.

It is a further object of this invention that the ion assisted coating process may employ vacuum evaporation as a means to generate the coating material to be applied to the surface.

It is a further object of this invention that the two-step process can be applied to mechanical devices made from metals, metal alloys, ceramics, plastics, or glasses.

It is a further object of this invention that the two-step process be capable of depositing a wide variety of tightly adherent coatings including but not limited to metals, oxides, nitrides, carbides, and diamond-like carbon.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
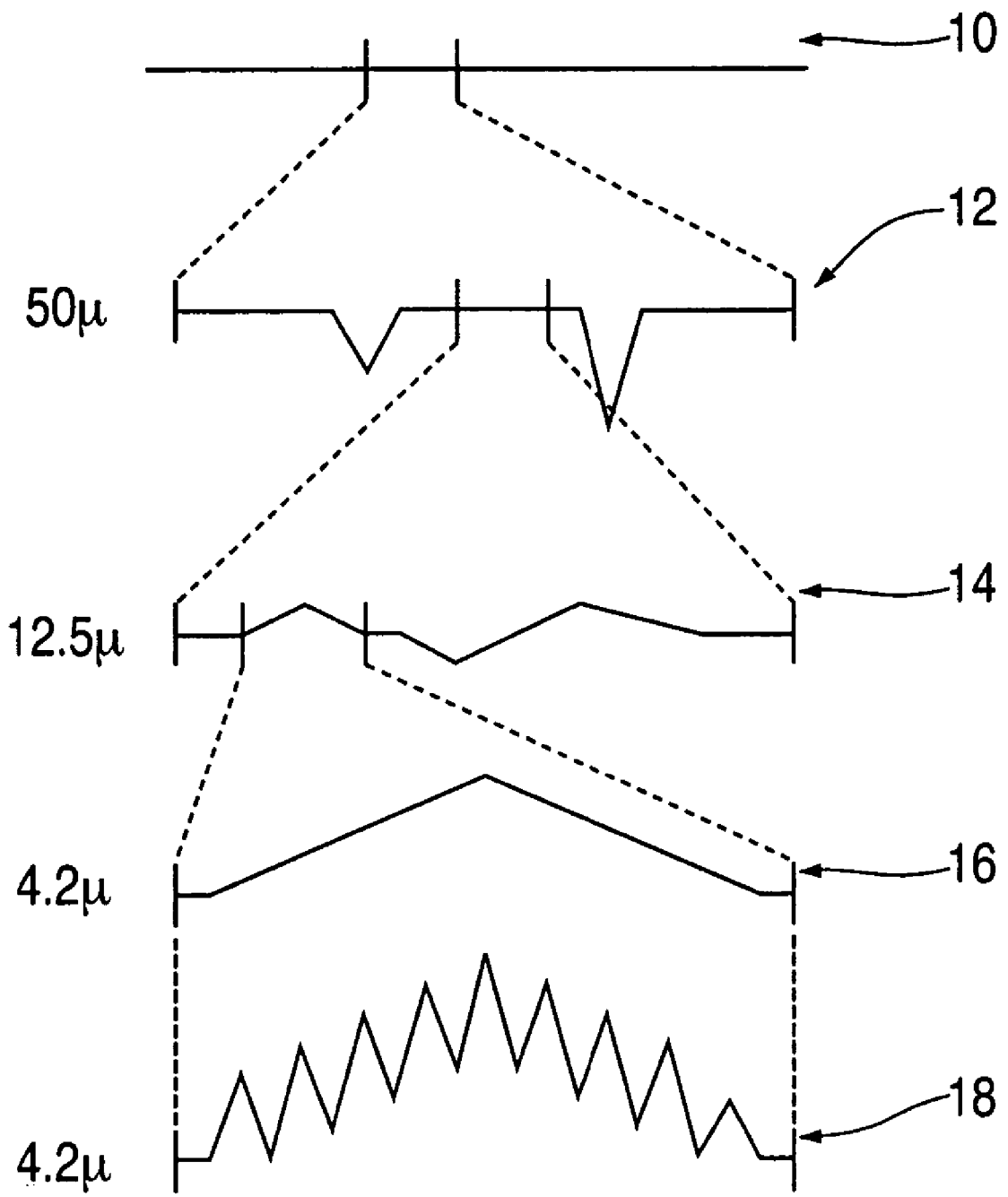
FIG. 1 is a diagrammatic cross-sectional representation of a structure on machined surfaces at increasing magnifications according to a preferred embodiment of the invention.

The invention will now be described with reference to the drawing figures, in which like reference numerals refer to like parts throughout. An embodiment in accordance with the present invention provides a unique apparatus and method to engineer the surfaces of mechanical devices in that a surface nanotexturing means is combined with a coating means in an uninterrupted two-step process to form either a nanotextured surface with a thin conformal coating or a nanotextured surface with an adherent thick coating which itself can be nanostructured throughout.

An embodiment of the present inventive apparatus and method is illustrated in FIG. 1. In FIG. 1, the surface of an article machined from a metallic material is observed without magnification at 10, and with incrementally higher levels of magnification at 12, 14, 16, and 18. At a magnification of 500×, as seen at 12, polishing marks and scratches with dimensions as small as 5 microns (5000 nanometers) can be resolved in the surface. At a magnification of 2000×, as seen at 14, the regions between the polishing marks show the crystalline grain structure of the bulk material, and features with dimensions as small as 1 micron (1000 nanometers) can be seen. At a higher magnification of 6000×, as seen at 16, the regions within the grains are usually featureless. When nanotextured, preferably using an ion beam sputtering technique, these featureless regions can develop a more structured topography, as seen at 18, containing preferentially-oriented conical structures with diameters and heights in the 200 to 1000 nanometer range. (Banks B. A., "Topography: Texturing Effects," Handbook of Ion Beam Processing Technology, Cuomo, J., Rossnagel, S., and Kaufman, H., eds., Noyes Publications, Westwood, N.J., 1989, herein incorporated by reference). The presence of these conical features results in an increase in the total surface area available, and an increase in density or number of active sites for mechanical, chemical, catalytic, or biological interaction.

Figure 2:
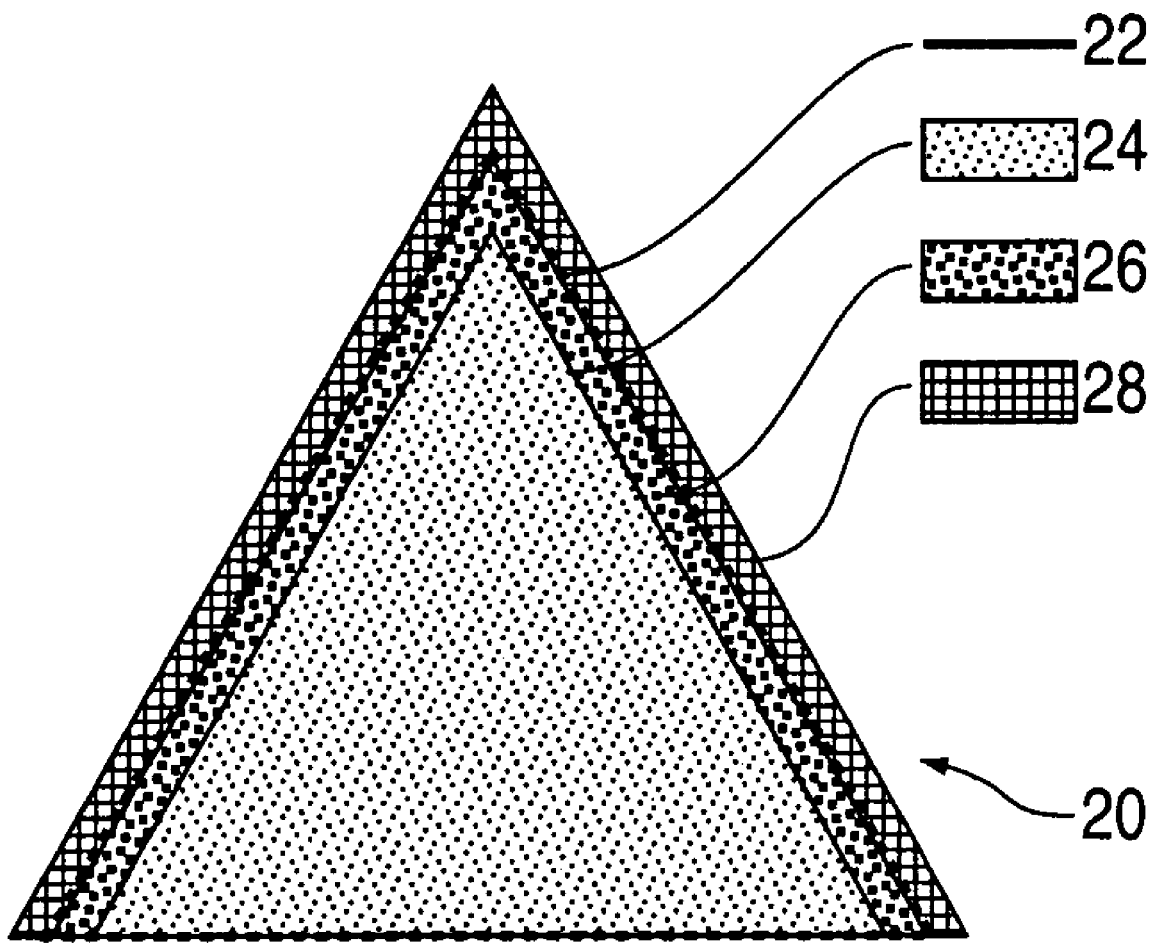
FIG. 2 is a diagrammatic cross-sectional representation of nanostructured features with conformal coating according to FIG. 1.

Referring to FIG. 2, application of a thin conformal coating 28, preferably by an IBED coating process (U.S. Pat. No. 5,055,318 to Deutchman et al., herein incorporated by reference), provides chemically, catalytically, or biologically active material that penetrates into and extends out from the nanostructured surface 20. FIG. 2 shows a coronal cross-section of a conical feature 20 of a base material 24 with a width of approximately 800 nanometers and a height of approximately 800 nanometers. The original outside margin of conical surface feature 20 is shown at 22. The active coating material is shown penetrating into the surface of the conical feature 20 forming a shallow alloyed case layer 26 to a depth of approximately 5 nanometers. The conformal coating 28 is shown to also extend out from the case layer 26 beyond the original surface 22 of the conical feature to a thickness of approximately 50 nanometers. Thus an adherent conformal coating is formed in and on the nanostructured conical feature without any substantial change in the dimension of the feature and no concealing of the desirable surface topography. The thin conformal coating 28 will have a nearly amorphous grain structure as dictated by the IBED coating process conditions.

Figure 3:
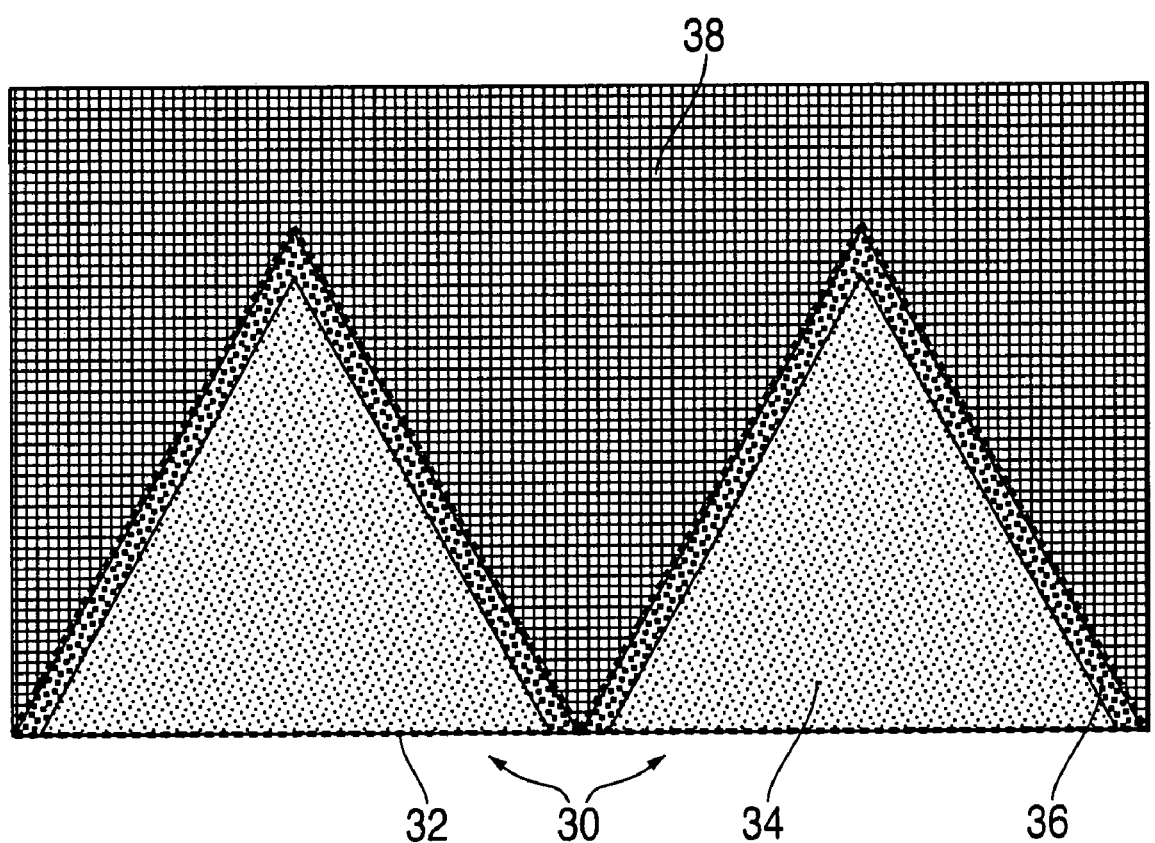
FIG. 3 is a diagrammatic cross-sectional representation of nanostructured features with conformal coating with a thicker, nanocrystalline, nearly amorphous coating grown from the conformal coating according to FIG. 1.

Referring to FIG. 3, the conformal coating can be grown further in thickness, however in this case the nanostructures will be concealed. This is appropriate when thick coatings are required for enhanced properties such as wear-resistance, fatigue resistance, or corrosion resistance. FIG. 3 shows a coronal cross-section of two adjacent nanometer size conical surface features of a base material 34 with a width of approximately 800 nanometers and a height of approximately 800 nanometers. The original outside margin of conical features 30 is shown at 32. The active coating material is shown penetrating into the surface of the conical features 30 forming a shallow alloyed case layer 36 to a depth of approximately 5 nanometers. The conformal coating 38 is shown to also extend out from the case layer 36 beyond the original surface 32 of the conical features and extending further to fill the space between adjacent surface features 30 and completely concealing them. Thus the conformal coating formed in addition the nanostructured conical features 30 is grown to a thickness that does conceal the nanostructured features. The thick coating 38 will have a nearly amorphous grain structure as produced by the IBED coating process conditions. Implementation of the two step treatment process is outlined as follows:

The typical parameters, and an estimated range of possible parameters used in the uninterrupted two step treatment process are as follows:

Step 1: Nanotexturing

|   | Description | Step 1 (Surface Texturing) Typical Process Parameters | Range of Process Parameters |
|---|---|---|---|
| A | Device placed in vacuum chamber on a rotatable articulated fixture which allows programmed orientation of the device during the process. | Vacuum: 1.0E(−07) Torr | Vacuum: 1.0E(−08) to 1.0E(−05) Torr |
| B | Surface of the article textured by ion beam sputtering with the ion beam from the augmenting ion source and manipulating the article such that the sputtering angle of incidence is maintained on the surfaces to be textured | Ion Species: Ar<br>Beam Energy: 1000 eV<br>Beam Current: 1.0 mA/cm$^2$<br>Angle of incidence between 45-75 degrees<br>Part Platen Rotation: 30 RPM<br>Time: 30 minutes | Ion Species: He, Ne, Ar, Kr, or Xe<br>Beam Energy: (0.1-100) keV<br>Beam Current: (0.01-1500) mA/cm$^2$<br>Angle of incidence between 10-90 degrees<br>Part Platen Rotation: 10-100 RPM<br>Time: (0.033-5000) minutes) |

Step 2: Coating (If by Sputter Evolution)

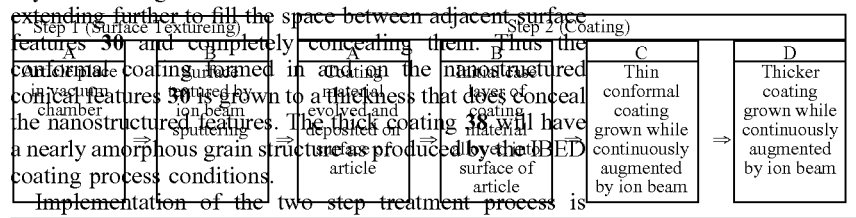

| Step 1 (Surface Textureing) | | Step 2 (Coating) | |
|---|---|---|---|
| A | B | C | D |
| invest features in vacuum chamber | grown to evolved and deposited on surface of article | Thin conformal coating grown while continuously augmented by ion beam | Thicker coating grown while continuously augmented by ion beam |

| | Step 2 (Coating, if by sputter evolution) | | |
|---|---|---|---|
| | Description | Typical Process Parameters | Range of Process Parameters |
| A | Sputter ion beam used to ion beam sputter coating material continuously the from target platen onto surface of device. | Ion Species: Ar<br>Beam Energy: 1000 eV<br>Beam Current: 2.5 mA/cm$^2$<br>Material: Various Species<br>Angle of incidence on target platen between 45 and 60 degrees<br>Evolution Rate: 0.2 Å/sec<br>Part Platen Rotation: 30 RPM | Ion Species: He, Ne, Ar, Kr, or Xe<br>Beam Energy: (0.1-100) keV<br>Beam Current (0.1-1500) mA/cm$^2$<br>Material: Various Species<br>Angle of incidence on target platen between 10 and 90 degrees<br>Evolution Rate: (0.008-120) Å/sec<br>Part Platen Rotation: 10-100 RPM |
| B | Augmenting ion beam used to alloy the first few layers of the sputtered coating material into device surface thus forming a case layer. | Ion Species: Ar<br>Beam Energy: 1000 eV<br>Beam Current 1.0 mA/cm$^2$<br>Material: Various Species<br>Part platen held at angle between 25 and 75 degrees to sputtered coating material<br>Time: 12 minutes<br>Part Platen Rotation: 30 RPM | Ion Species: O, N, He, Ne, Ar, Kr, or Xe<br>Beam Energy: (0.1-100) keV<br>Beam Current: (0.1-1500) mA/cm$^2$<br>Material: Various Species<br>Part platen held at angle between 10 and 85 degrees to sputtered coating material<br>Time: 0.1-60 minutes<br>Part Platen Rotation: 10-100 RPM |
| C | Thin conformal coating is grown out from the alloyed case layer as ion beam sputtering of the target continues. Augmenting ion beam used to control the composition and crystal structure of the coating as it is grown. | Ion Species: Ar<br>Beam Energy: 200 eV<br>Beam Current: 0.05 mA/cm$^2$<br>Material: Various Species<br>Part platen held at angle between 25 and 75 degrees to sputtered coating material<br>Thickness: 50 Å<br>Part Platen Rotation: 30 RPM | Ion Species: O, N, He, Ne, Ar, Kr, or Xe<br>Beam Energy: (0.1-100) keV<br>Beam Current (0.01-1500) mA/cm$^2$<br>Material: Various Species<br>Part platen held at angle between 10 and 85 degrees to sputtered coating material<br>Thickness: (10-5000) Å<br>Part Platen Rotation: 10-100 RPM |
| D | Coating is grown out from the alloyed case layer as ion beam sputtering of the target continues. Augmenting ion beam used to control the composition and crystal structure of the coating as it is grown. | Ion Species: Ar<br>Beam Energy: 200 eV<br>Beam Current: 0.05 mA/cm$^2$<br>Material: Various Species<br>Part platen held at angle between 25 and 75 degrees to sputtered coating material<br>Thickness: 20,000 Å<br>Part Platen Rotation: 30 RPM | Ion Species: O, N, He, Ne, Ar, Kr, or Xe<br>Beam Energy: (0.1-100) keV<br>Beam Current (0.01-1500) mA/cm$^2$<br>Material: Various Species<br>Part platen held at angle between 10 and 85 degrees to sputtered coating material<br>Thickness: (100-100,000) Å<br>Part Platen Rotation: 10-100 RPM |

Step 2: Coating (If by Vacuum Evaporation)

| | Step 2 (Coating, if by vacuum evaporation) | | |
|---|---|---|---|
| | Description | Typical Process Parameters | Range of Process Parameters |
| A | E-gun evaporator used to melt and evaporate coating material continuously onto surface of device. | Material: Various Species<br>Part platen held at angle between 25 and 75 degrees to evaporator flux<br>Evolution Rate: 5 Å/sec<br>Part Platen Rotation: 30 RPM | Material: Various Species<br>Part platen held at angle between 10 and 90 degrees to evaporator flux<br>Evolution Rate: (0.008-120) Å/sec<br>Part Platen Rotation: 10-100 RPM |
| B | Augmenting ion beam used to alloy the first few layers of the evaporated coating material into device surface thus forming a case layer. | Ion Species: Ar<br>Beam Energy: 1000 eV<br>Beam Current: 1.0 mA/cm$^2$<br>Material: Various species<br>Part platen held at angle between 25 and 75 degrees to evaporator flux<br>Time: 12 minutes<br>Part platen Rotation: 30 RPM | Ion Species: O, N, He, Ne, Ar, Kr, or Xe<br>Beam Energy: (0.1-100) keV<br>Beam Current (0.1-1500 mA/cm$^2$<br>Material: Various Species<br>Part platen held at angle between 10 and 90 degrees to evaporator flux<br>Time: 0.1-60 minutes<br>Part Platen Rotation: 10-100 RPM |
| C | Thin conformal coating is grown out from the alloyed case layer as evaporation of the coating material continues. Augmenting ion beam used to control the composition and crystal structure of the coating as it is grown. | Ion species: Ar<br>Beam Energy: 200 eV<br>Beam Current: 0.05 mA/cm$^2$<br>Material: Various species<br>Part platen held at angle between 25 and 75 degrees to evaporator flux<br>Thickness: 50 A | Ion Species: O, N, He, Ne, Ar, Kr, or Xe<br>Beam Energy: (0.1-100) keV<br>Beam Current (0.01-1500) mA/cm$^2$<br>Material: Various Species<br>Part platen held at angle between 10 and 90 degrees to evaporator flux<br>Thickness: (10-5000) Å<br>Part Platen Rotation: 10-100 RPM |

Step 2 (Coating, if by vacuum evaporation)

| | Description | Typical Process Parameters | Range of Process Parameters |
|---|---|---|---|
| D | Coating is grown out from the alloyed case layer as evaporation of the coated material continues. Augmenting ion beam used to control the composition and crystal structure of the coating as it is grown | Part Platen Rotation: 30 RPM<br>Ion species: Ar<br>Beam Energy: 200 eV<br>Beam Current: 0.05 mA/cm$^2$<br>Material: Various Species<br>Part platen held at angle between 25 and 75 degrees to evaporator flux<br>Thickness: 20,000 Å<br>Part Platen Rotation: 30 RPM | Ion Species: O, N. He, Ne, Ar, Kr, or Xe<br>Beam Energy: (0.1-100) kV<br>Beam Current (0.01-1500) mA/cm$^2$<br>Material: Various Species<br>Part platen held at angle between 10 and 90 degrees to evaporator flux<br>Thickness: (100-100,000) Å<br>Part Platen Rotation: 10-100 RPM |

Figure 4:
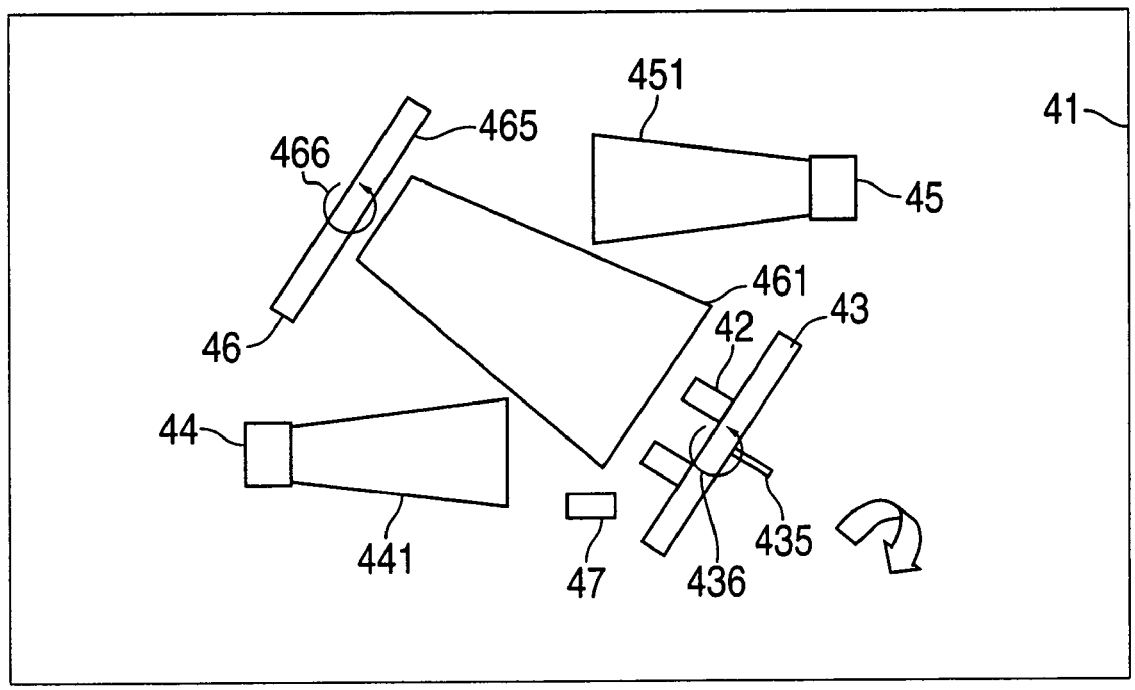
FIG. 4 is a diagrammatic representation of an IBED coating process utilizing ion beam sputter evolution of coating material according to a preferred embodiment of the invention.

Referring to FIG. 4, a preferred embodiment of the invention requires that the uninterrupted two-step process be carried out in a specific manner and under certain conditions. FIG. 4 shows a vacuum vessel 41 within which the treatment process is carried out. A high vacuum environment is maintained in the vacuum vessel in order to allow a high degree of control over the quality of the coating formed in and on the surface of the article. The articles to be treated 42 are affixed to a part platen 43 which allows proper control of positioning of the articles during the separate nanotexturing and coating steps. The part platen 43 can rotate about its axis 435 and tilt about its center 436. The tilt angles and rotation rates are chosen such that the surfaces of the parts 42 to be treated are nanotextured at the proper angle and the thin conformal coating (or thicker coating) is applied at the proper angle and with good uniformity on the surfaces to be coated.

A texturing/augmenting ion beam source 44 is located within the vacuum chamber and generates a broad beam of texturing/augmenting ions 441 which are used initially to nanostructure the surface of the article by sputtering (first step), and then to promote and control formation of the thin conformal coating to be applied to the nanostructured surface of the article (second step). If a thicker coating, continuous with the thin conformal layer is desired, ion beam source 44 which generates texturing/augmenting ions 441 is also used to promote and control the growth of the thicker coating. An additional ion beam source 45 is located within the vacuum vessel which produces a beam of sputtering ions 451 which is directed at a target platen 46 which contains the species with which the article is to be coated.

Impingement of the sputtering ions 451 on the target platen 46 produces an atomistic flux of coating material 461 which sprays onto the nanostructured surface of the articles to be coated 42. The target platen 46 can be tilted at an angle about its center 466 such that its surface 465 can be aligned relative to sputter ion flux 451 to optimize the sputter yield of the coating material. The beam of texturing/augmenting 441 ions is simultaneously applied to the surface of the articles 42 and is used initially to mix the coating material into the surface of the articles 42 forming an alloyed case layer in the surface, and then used to control the composition and crystal structure of the thin conformal coating as it is grown out from the alloyed case layer. A thickness measuring gauge 47 is positioned proximal the part platen 43 in order to monitor the arrival of the sputtered coating species 461 and aid in controlling formation of the case layer, the thin conformal coating, and then the thicker coating if desired.

Figure 5:
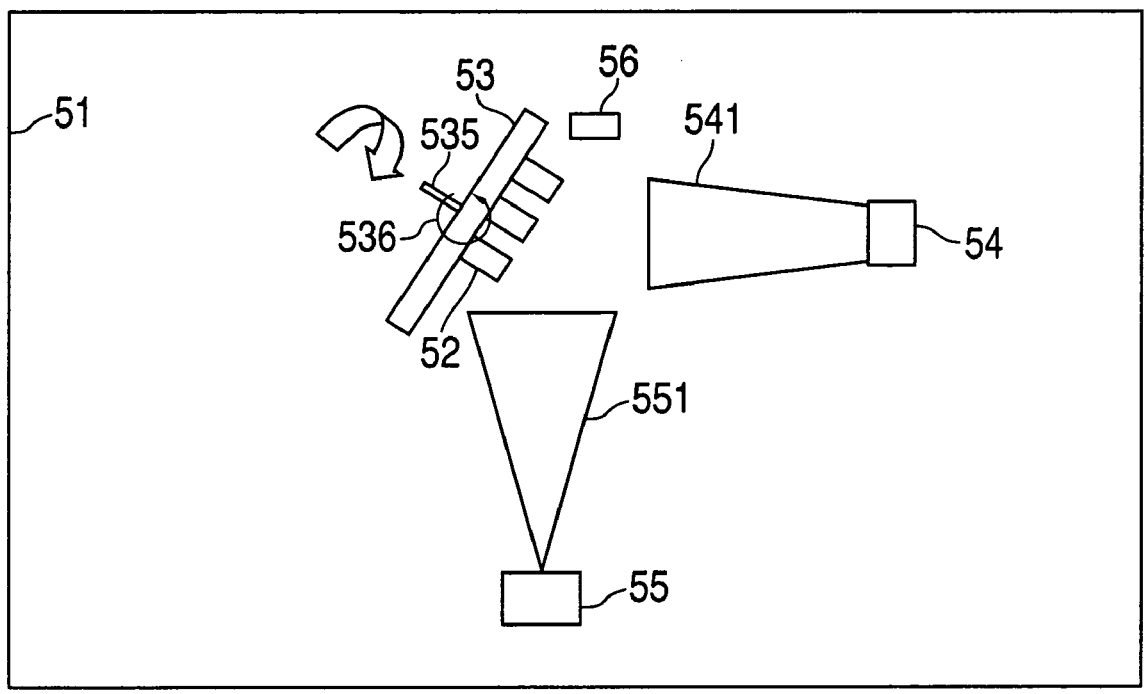
FIG. 5 is a diagrammatic representation of an IBED coating process utilizing e-gun evaporation of coating material according to a second embodiment of the invention.

Referring to FIG. 5, in an alternative embodiment for practice of the present invention an electron gun evaporator is substituted for the sputter ion source in order to evolve a flux of coating material. FIG. 5 shows a vacuum vessel 51 within which the treatment process is carried out. A high vacuum environment is maintained in the vacuum vessel in order to allow a high degree of control over the quality of the coating formed in and on the surface of the article. The articles to be treated 52 are affixed to a part platen 53 which allows proper control of positioning of the articles during the separate nanotexturing and coating steps. The part platen 53 can rotate about is axis 535 and tilt about its center 536. The tilt angles and rotation rates are chosen such that the surfaces of the parts 52 to be treated are nanotextured at the proper angle and the thin conformal coating (or thicker coating) is applied at the proper angle and with good uniformity on the surfaces to be coated. A texturing/augmenting ion beam source 54 is located within the vacuum chamber and generates a broad beam of texturing/augmenting ions 541 which are used initially to nanostructure the surface of the article by sputtering (first step), and then to promote and control formation of the thin conformal coating to be applied to the nanostructured surface of the article (second step). If a thicker coating, continuous with the thin conformal layer is desired, ion beam source 54 which generates texturing/augmenting ions 541 is also used to promote and control the growth of the thicker coating. An electron gun evaporator 55 is located within the vacuum vessel which produces evaporated coating material 551 which sprays onto the nanostructured surface of the articles to be coated 52. The beam of texturing/augmenting 541 ions is simultaneously applied to the surface of the articles 52 and is used initially to mix the coating material into the surface of the articles 52 forming an alloyed case layer in the surface, and then used to control the composition and crystal structure of the thin conformal coating as it is grown out from the alloyed case layer. A thickness measuring gauge 56 is positioned proximal the part platen 53 in order to monitor the arrival of the evaporated coating material 551 and aid in controlling formation of the case layer, the thin conformal coating, and then the thicker coating if desired.

It is important that the two-step treatment process be carried out sequentially in the same vacuum chamber without releasing the high vacuum to atmospheric pressure between steps. If this occurs a latent oxide layer will form on the nanostructured surface and will interfere with the formation of the conformal coating. It is also important to accurately control the intensities of the texturing/augmenting ion beam and the angular position of the articles to be treated relative to this directional beam such that the nanostructures are developed on the surface and the surface is not smoothed out.

EXAMPLES

Treated Prosthesis with Improved Biological Activity

Figure 6:
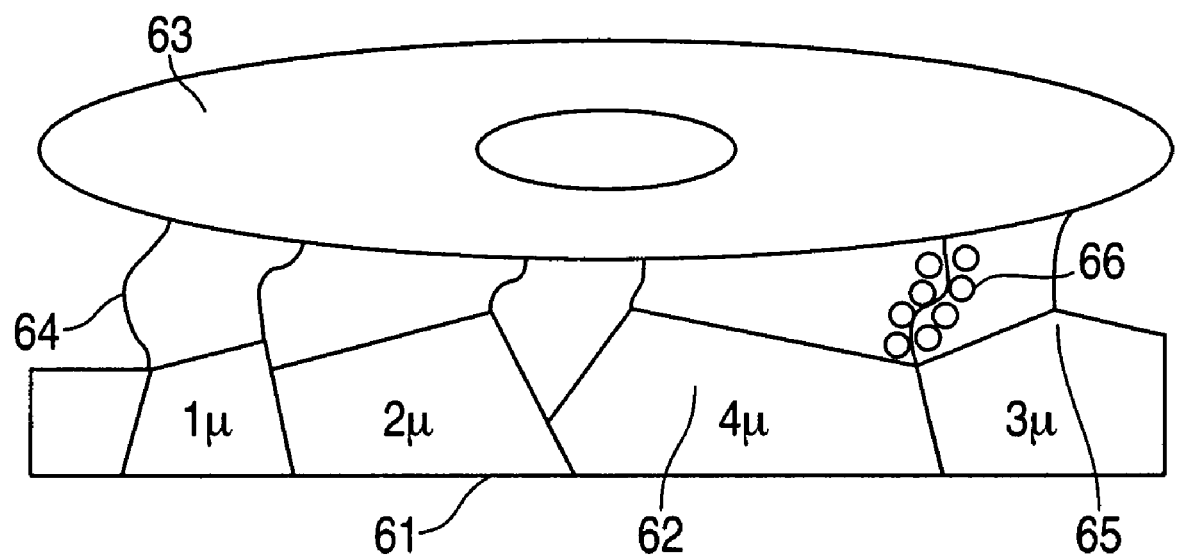
FIG. 6 is a diagrammatic representation of a prosthesis treated using conventional means.

Referring to FIG. 6, articles that can benefit from application of the inventive uninterrupted two-step treatment process to improve the biological activity of surfaces of articles, include dental and orthopaedic prostheses used to restore dental and skeletal function. In the case of these prostheses it is necessary that after implantation in skeletal structures, natural bone grows and attaches itself directly to the surface of the prosthesis as firmly and as rapidly as possible so that normal function can be restored. FIG. 6 shows a conventional surface of an implanted prosthesis and describes the initial biological events that must proceed in order for natural bone to grow onto the surface of the prosthesis, become mineralized, and form a firm bond. The surface 61 of the prosthesis is shown to be coated 62 with calcium hydroxylapatite (HA) in crystalline form with crystal dimensions on the order of 10 micrometers or less. The HA is usually deposited on the prosthesis surface with a thermal spray technique. Immediately after implantation, osteoblast cells 63 migrate towards the surface 61 of the prosthesis and produce collagenous fibers 64 which attach to active sites 65 on the surface of the HA coating 62. Soon after attachment, the collagenous fibers 64 begin to mineralize 66 and natural bone begins to grow and attach to the layer of HA coating 62. A slight dissolution of the crystalline HA coating provides the source of calcium for the mineralization process. The bone growth process will continue and proceed more rapidly and with better adhesion if there is a high density of locations on the prosthesis surface where osteoblast cells can deposit collagenous fibers, and if the HA coating is thin and amorphous.

Figure 7:
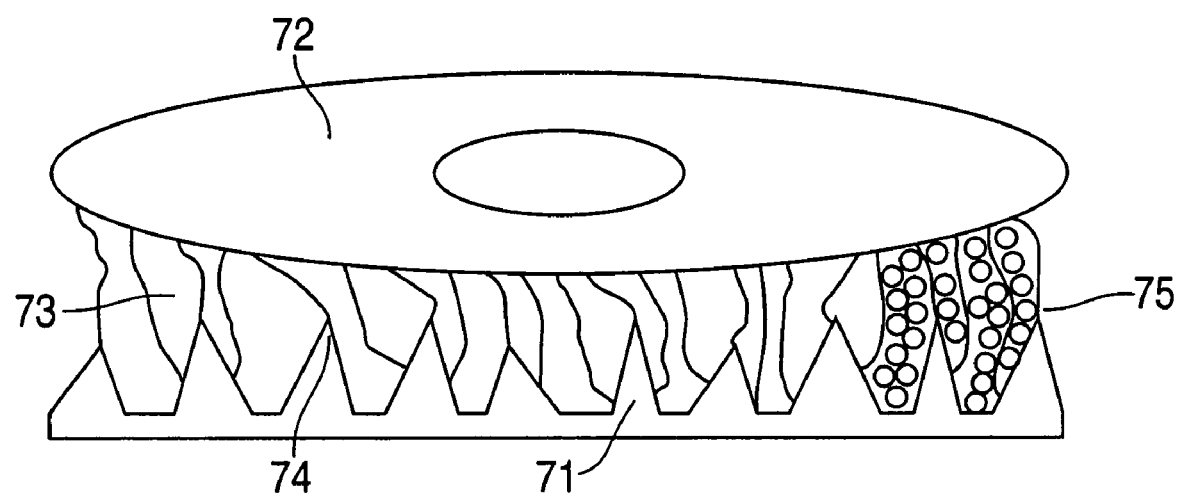
FIG. 7 is a diagrammatic representation of a prosthesis treated using the method according to a preferred embodiment of the invention.

FIG. 7 shows the surface of an implanted prosthesis treated by the uninterrupted two-step process of a preferred embodiment of the invention. In this example the surface 71 of the prosthesis has been nanotextured and provided with a thin conformal coating of nearly amorphous HA according to the methods of the present invention. After implantation, osteoblast cells 72 migrate toward the nanostructured surface of the prosthesis 71 and produce collagenous fibers 73 which attach to active sites 74 on the surface. Soon after attachment, the collagenous fibers 73 begin to mineralize 75 and natural bone begins to grow and attach to the HA coated nanostructured surface 71. Dissolution of the thin amorphous HA coating provides the source of calcium for the mineralization process, and the bone attaches directly to the nanostructured surface of the prosthesis instead of to the HA coating as in the case of a prosthesis with a conventional thermal sprayed thick HA coating. Also, in this example since the nanostructured surface 71 has a higher density of active sites than a thermal sprayed surface, more collagenous fibers 73 are attached per unit area on the implant surface 71, and the bone growth process will proceed more rapidly and form a stronger bone-implant bond.

The increased biological activity offered by the present invention's uninterrupted two-step treatment process has been confirmed on the surfaces of dental implants fabricated from titanium alloy (Ti-6Al-4V) material. The treated devices have been implanted in canine and swine models, and a series of mechanical studies and analyses of the histomorphology of the bone-prosthesis interface have been completed (Coelho, P., "Histomorphometric and Biomechanical Studies of a Surface Modified Titanium Alloy Implant," M.S. Thesis, Univ. of Alabama, 2002, herein incorporated by reference) with the following results.

- Nanotextured-HA coated surfaces have highly engineered nanotopography and reduced coating thickness, thus enabling direct bone anchorage to the metallic substrate instead of to an intermediate coating.
- Pull out tests from canine tibiae (at 2 and 4 week implantation times) show no failure at the IBED HA-metal interface.
- Histomorphometric and biomechanical evaluation of the bone-implant interface indicates that new bone around the nanotextured-HA coated implants has better mechanical properties.
- Nanotextured-HA coated surfaces showed significantly higher levels of bone activity at four (4) weeks in cortical bone regions than conventional HA thermal sprayed surfaces.
- Bone activity drops to physiologic levels in regions further than 1 mm from the implant surface indicating confined bone-biomaterial interaction phenomena.

Many other articles can be treated with the inventive process to improve their chemical, mechanical, and catalytic properties. Examples of components that can benefit from nanotextured surfaces with thin conformal coatings are as follows:

| Article | Textured Surface With Conformal Coating | Application |
|---|---|---|
| Bearing Race | TiN | Wear resistant nanotextured surface acts to more efficiently trap and hold lubricants for longer bearing performance. |
| $H_2$ Generator | Pt | Increased surface area increases the efficiency of fuel cell reformer for catalytic production of $H_2$ from hydrocarbons. |
| Engraving Roll | TiN | Wear resistant nanotextured surface acts to more efficiently trap and hold inks for better image quality and longer engraving roll life. |
| Spinarette | Pt | Increased catalytic surface area on spinarette used for production of Kapton. Also eliminates fabrication of spinarette from bulk Pt metal. |
| Hot Section Blade for Gas Turbine Engine | YSZ | Directly bonded yttria stabilized zirconia (YSZ) precursor layer for thermal sprayed oxidation protection coating (eliminates the need for a thermal sprayed MCrAlY bond layer) |

Examples of components that can benefit from thicker coatings that are themselves nanostructured by the inventive process are as follows:

| Article | Nanostructured Thicker Coating | Application |
|---|---|---|
| Tableting Punch | TiN | Wear-resistant nanotextured coating acts to reduce wear on critical punch surfaces thereby improving tool life. |
| Tableting Punch | TiN | Wear-resistant nanotextured coating acts to reduce sticking on critical punch surfaces thereby improving tablet manufacturing productivity |

-continued

| Article | Nanostructured Thicker Coating | Application |
|---|---|---|
| Plastic Mold Die | $Cr_2N$ | Corrosion-resistant nanotextured coating reduces chemical attack on plastic injection mold tooling thereby improving tool life and finish on the surface of the molded part |
| Hot Section Blade for Gas Turbine Engine | $Al_2O_3$ | Electrically insulating coating that survives temperatures up to 700 degrees Centigrade applied to superalloy turbine blades upon which nickel-chromium thin film gauges can be vapor deposited for stress measurement. |
| Gear Pump Impeller | TiN | Wear-resistant nanotextured coating acts to reduce wear on the surfaces gear pump impellers used to pump highly abrasive slurries thereby extending part life. |

Additional Applications Listed by Market Sector

| Market | Need Driven Applications |
|---|---|
| Automotive OEM | Engine Valves, Pistons, Piston Rings, Fuel Injectors, Fuel Valves, Gas Turbine Engine Components, Transmission Valves, Gears, Bearings, Hydraulic Elements, Actuators, Strut Rods, Aluminum Wheels |
| Aircraft OEM | Engine Components (blades, rotors, disks, seals, bearings, injectors), Hydraulic Elements, Actuators, Mechanical Drives, Gears, Power Transmission Elements, Shafts, Landing Gear Assemblies, Coatings on Plastics |
| Aerospace OEM | Coatings on C/C Composites, Coatings on Plastics, Coatings on Metals, Thin Film Sensors (temperature, stress, corrosion) |
| Medical Component | Surgical Components (Conventional, Laser, Laparoscopic), Pump Elements (external and internal), Fluid Delivery Elements, Catheters, Orthopedic Implants, Dental Implants, Bone Screws and Plates |
| Power Generation | Steam Turbine Vanes, Gears, Bearings, Shafts, Control Rods for nuclear reactors |
| Printing/ Engraving | Printing Rolls and Plates, Engraving Plates, Web Coating Rolls (plastic and paper), Paper Making and Cutting Hardware |
| Oil/Gas Exploration | Seals, Rings, Valves |
| Misc. Machinery | Electric Motors, Mechanical Actuators, Hydraulic Valves and Pistons, Pneumatic Valves and Pistons, Shafts and Rotors, Pump Elements, Dental Drills (air and water), Compressor Elements (seals, vanes, valves), Engine Parts (pistons, rings, cylinder liners, cams) |
| Metal Rolling | Calendering Rolls, Zensimer Rolls |
| General Tooling | Stamping, Powder Metal Compaction, Plastic Molding, Glass Molding, Tabletting, Rubber Molding, Al/Zn Die Casting, Injection Molding Screws, Cutting Tools, Gages, Magnetic Tape Rollers, Consumer Tools |
| Optical Application | Mirrors, Lenses, Reflectors, Active/Passive Fiber Optic Elements |
| Treatment of Materials | Pretreatments to facilitate bonding and joining, Coil Steel, Roll Coating of Plastics |
| Environment Driven | Replacement/Alternative for chemical plating (Cr, Cd, Ni) |

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A continuous, two-step method for the surface treatment of an item, comprising the steps of:
    placing the item into a vacuum chamber, the item having a substrate;
    texturing the substrate creating a nanotextured surface with a plurality of bioattachment sites, wherein the bioattachment sites provide attachment sites for osteoblast cells to attach collagenous fibers and wherein the texturing comprises ion beam sputtering the substrate; and
    coating the nanotextured surface so that surface-related properties are made, wherein the coating step comprises:
    imbedding ions into the substrate to generate an alloyed case layer in the substrate; and
    generating a conformal coating on the alloyed case layer, wherein the texturing and coating steps are performed while maintaining a continuous vacuum in the vacuum chamber.

2. The method of claim 1, further comprising the steps of:
    imbedding ions into the substrate to generate the alloyed case layer to a depth of about 5 nanometers below the nanotextured surface, wherein said alloyed case layer does not conceal the morphology of the nanotextured surface; and
    growing the conformal coating while continuously augmenting with an ion beam device.

3. The method of claim 1, wherein the grain structure of the conformal coat is substantially amorphous.

4. The method of claim 2, further comprising the step of:
    growing a thicker coating from the conformal coating, wherein the thicker coating itself is nanostructured as it is grown.

5. The method of claim 4, wherein the grain structure of the thicker coating is substantially amorphous.

6. The method of claim 4, wherein the thicker coating is grown while being continuously augmented by an ion beam device.

7. The method of claim 1, wherein the texturing process uses a directional ion beam sputtering device.

8. The method of claim 1, wherein the texturing process uses a directional ion beam sputtering device that intercepts all surfaces to be treated within a certain specified angular range.

9. The method of claim 1, wherein the texturing process uses a directional ion beam sputtering process that intercepts all surfaces to be treated within a certain specified angular range, wherein the angular range is achieved by motion of the components in at least two dimensions.

10. The method of claim 2, wherein the coating process to grow the conformal coating is an ion assisted coating process.

11. The method of claim 4, wherein the coating process used to grow the thicker coating out continuously from the conformal coating is an ion assisted coating process.

12. The method of claim 11, wherein the ion assisted coating process uses ion beam sputtering to generate the coating material to be applied to the surface.

13. The method of claim 11, wherein the ion assisted coating process uses vacuum evaporation to generate the coating material to be applied to the surface.

14. The method of claim 1, wherein the two-step process is applied to items made from metals, metal alloys, ceramics, plastics, or glasses.

15. The method of claim 2, further comprising the step of:
depositing an adherent coating to the surfaces, the adherent coating is a material selected from a group consisting of metals, oxides, nitrides, carbides, and diamond-like carbon.

16. The method of claim 8, wherein the angular range is approximately 45 to 75 degrees.

17. The method of claim 9, wherein the angular range is approximately 10 to 90 degrees.

* * * * *